United States Patent
Lee et al.

(10) Patent No.: US 6,922,068 B2
(45) Date of Patent: Jul. 26, 2005

(54) METHOD FOR TESTING HIGH POWER SMD TYPE IC WITH METHOD FOR MAKING MANUAL AND AUTOMATION TEST BASE

(76) Inventors: Shih-Hsiung Lee, 4F, No. 10, Alley 14, Lane 283, Sec. 3, Roosevelt Road, Taipei (TW); Shien-Neng Wu, 5F, No. 3, Lane 182, Chung-Cheng Road, Hsintien, Taipei Hsien (TW)

( * ) Notice: Subject to any disclaimer, the term of this patent is extended or adjusted under 35 U.S.C. 154(b) by 229 days.

(21) Appl. No.: 10/391,588

(22) Filed: Mar. 20, 2003

(65) Prior Publication Data

US 2004/0183555 A1 Sep. 23, 2004

(51) Int. Cl.[7] .............................................. G01R 31/02
(52) U.S. Cl. ..................... 324/754; 324/158.1; 324/755
(58) Field of Search ................. 324/754, 758, 324/765, 755, 158.1, 72.5; 438/14, 17, 18; 365/201

(56) References Cited

U.S. PATENT DOCUMENTS 5,504,436 A * 4/1996 Okutsu ....................... 324/761
5,729,147 A * 3/1998 Schaff ........................ 324/755

* cited by examiner

*Primary Examiner*—Nestor Ramirez
*Assistant Examiner*—Jimmy Nguyen
(74) *Attorney, Agent, or Firm*—Troxell Law Office, PLLC

(57) ABSTRACT

A method for testing a high power SMD type IC with a method for making manual and automation test base includes the following steps: provide a test socket for the SMD type IC; inversely place the SMD type IC on a lower base of the test socket in a way of the character side thereof facing downward and the connection pins facing upward; and place an upper base on the SMD type IC and the lower base so as to be fixed. By way of the SMD type IC being inversely placed, it is possible for the connection pins of the IC to increase the area of the connection pins on the IC contacting with the connection pins of lower base in the test socket and it is possible for the 8° slant angle of each connection pin on the IC not to become damaged while the IC 1 is fixed to the test socket forcefully. In this way, the contact impedance of each connection pin can be lowered such that the test socket can endure greater current during the high power SMD type IC being tested.

2 Claims, 5 Drawing Sheets

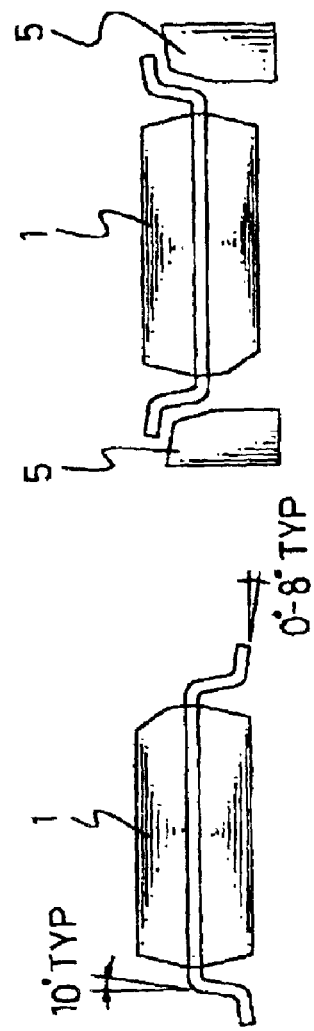
FIG. 3
FIG. 2 (PRIOR ART)
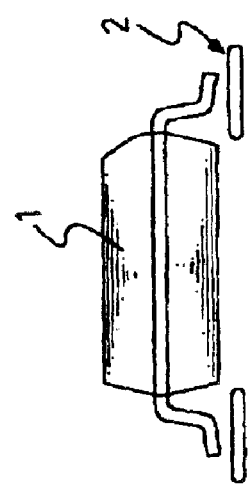
FIG. 1 (PRIOR ART)

METHOD FOR TESTING HIGH POWER SMD TYPE IC WITH METHOD FOR MAKING MANUAL AND AUTOMATION TEST BASE

BACKGROUND OF THE INVENTION

1. Field of the Invention

The present invention relates to a method for testing high power SMD (Surface Mount Device) type IC (Integrated Circuit) with method for making manual and automation test base and particularly to a method, with which, by way of the SMD type IC being inversely placed, the connection pins of the IC can increase the contact area with the connection pins of lower base in the test socket and the contact impedance of each connection pin can be reduced such that the test socket can endure greater current during the high power SMD type IC being tested.

2. Description of Related Art

Due to technology of semiconductor progressing largely, the speed and the efficiency of IC are getting higher and SMD type IC has become a main stream instead of being a special miniature part in the past. Especially, taking the advantage of new technology developed in the recent years, the SMD type IC becomes possible to work with a power of several amperes. Further, high frequency switching technology provides highly efficient and digitally controlled man-machine interface so that the SMD type IC enters the era of high power with large current and the application thereof is prosperous. Hence, the SMD type IC will become a main stream in the future.

However, the conventional test socket for the SMD type IC has not been broken through yet and it is only possible to offer a test capability with a couple of ten micro-amperes of constant current and with sharp wave current under several hundred amperes. Further, the conventional socket may result in IC damage under high frequency so that it is unable to comply with the technology development.

With reference to FIG. 1, a SMD type IC 1 being placed on and fixed to a lower base of a test socket with the right position is usually done with the conventional method before a test being performed.

With reference to FIG. 2 companying with FIG. 1, the SMD type IC at the connection pins thereof has a specification of 8° downward slant to facilitate the SMD type IC being associated with tin paste and a print circuit board. Hence, too much large joining force has to be avoided in order to not damaging the specification of 8° downward slant. But, if the SMD type IC is not fixed forcefully, an excessive contact resistance may occur between the connection pins of the SMD type IC 1 and the connection pins of the lower base. In addition, the contact length of the connection pins of SMD type IC with the connection pins of the lower base 2 only 0.16 mm (max) so that it results in the test socket is incapable of testing the high power SMD type IC with an output of several amperes. As a result, the conventional way of placing the SMD type IC with right position without breaking the specification has two significant deficiencies: 1) extremely less contact area leading to small current, and 2) extremely less pressure is originated from complying with the specification of 8° downward slant. Thus, the conventional test socket is incapable of test high power SMD type IC and a simulation test is utilized instead currently. However, the simulation test results in deviation from the actual situation to affect the stabilization of the finished SMD type IC.

SUMMARY OF THE INVENTION

The crux of the present invention resides in that a method for testing SMD type IC is disclosed to have the SMD type IC beings Inversely positioned to increase contact area of the connection pins of the IC with the connection pins of lower base in the test socket and to reduce the contact impedance of each connection pin such that the test socket can endure greater current during the high power SMD type IC being tested.

An object of the present invention is to provide a test method for a SMD type IC mounted on a circuit board and a method for making a practical and reliable test socket for the SMD type IC.

Accordingly, the present invention provides a method for testing a high power SMD type IC includes the following steps: provide a test socket for the SMD type IC; place the SMD type IC on a lower base of the test socket in a way of the character side thereof facing downward and the connection pins facing upward; and place an upper base on the SMD type IC and the lower base so as to be fixed with a U-shaped elastic plate associated with a stir screw. By way of the SMD type IC being inversely placed, it is possible for the connection pins of the IC to increase the area of the connection pins on the IC contacting with the connection pins of lower base in the test socket and it is possible for the 8° slant angle of each connection pin on the IC not to become damaged while the IC 1 is fixed to the test socket forcefully. In this way, the contact impedance of each connection pin can be lowered such that the test socket can endure greater current during the high power SMD type IC being tested.

Next, the present invention provides a method for making a lower base of the test socket for a high power SMD type IC by way of accumulation layers includes following steps: multiple copper plates and multiple insulation plates are arranged in a sequence of odd layers being copper plates and even layers being insulation plates; and once the required layers are reached, the layers are adhered to each other with glue.

Further, the present invention provides a method for making an upper base of th test socket for a high power SMD type IC includes following steps: the upper base at the part for contacting with connection pins of the IC is made of engineering plastics; the bottom of the upper base is provided with two juts corresponding to the bottom of connecting pins on the IC so as to offer a proper and definite pressure angle; the engineering plastics at the central part thereof is embedded with a copper plate and the edge thereof is press fit with a copper base so that the high heat generated by the IC can be guided to the copper base directly; and the copper plate is provided a position for being inserted with a temperature sensor component to sense the temperature at the bottom of the IC.

BRIEF DESCRIPTION OF THE DRAWINGS

The present invention can be more fully understood by reference to the following description and accompanying drawings, in which:

FIG. 1 is a plan view illustrating a conventional test method of SMD type IC;

FIG. 2 is a plan view of illustrating a criterion of declining 8° for a SMD type IC;

FIG. 3 is a plan view of an embodiment of a test method according to the present invention illustrating the SMD type IC being inversed;

DETAILED DESCRIPTION OF THE PREFERRED EMBODIMENT

Figure 7:
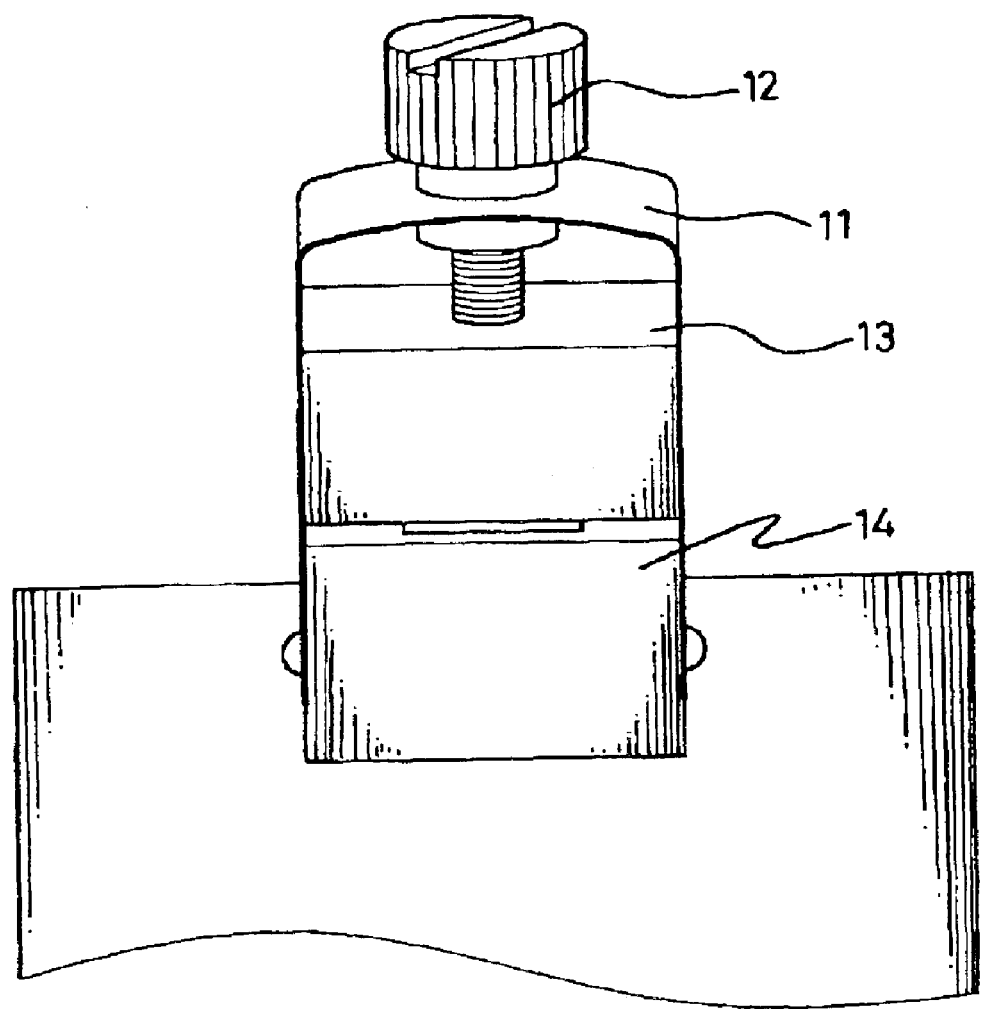
FIG. 7 is a perspective view of a finished manual test socket of the IC according to the present invention.

Referring to FIG. 3, an embodiment of test method for a high power SMD type IC according to the present invention is illustrated. The test method for a high power SMD type IC according to the present invention is to place the SMD type IC on a lower base 14 of a test socket inversely as shown in FIG. 7 and the lower base 14 has nodal points 5, which are not less than the number of tested SMD type IC such that it is possible for each tested SMD IC at contact pins to have a length 1.30 mm (max) for contacting with the corresponding nodal points 5. The contact length 1.30 mm is almost eight times of that used in the conventional method. Further, it is possible for the contact pins to be fixed between the upper base 13 and the lower base 14 forcedly as shown in FIG. 7 without damaging the 8° slant angle of the SMD type IC 1 so that contact impedance of the nodal points can be lowered down to allow the test socket being capable of endure higher current while the high power SMD type IC, which providing current above several amperes. The inverted IC in the method of the preceding embodiment is worked in accordance with the shape of the upper part thereof for offering a lower base of a test socket thereof with a complete tight joint. Further, a contact pressure about 10 Kg/m² (about 3–10 times of contact pressure exerting to the conventional right position).

The test method of the present invention includes following steps: provide a test socket for the SMD type IC 1; inversely place the SMD type IC 1 on a lower base 14 of the test socket; and place an upper base 13 on the SMD type IC 1 so that the SMD type IC 1 is disposed between the lower base 14 and the upper base 13 and finally the upper base 13 is fixed. Due to the SMD type IC 1 being inversely placed, it is possible for the connection pins of the IC 1 to have greater contact areas in case of the pins contacting with the nodal points 5 and it is possible for the 8° slant angle of each connection pin not to become damaged while the IC 1 is mounted to the test socket forcedly. In this way, the contact impedance of each nodal point 5 can be lowered such that the test socket can endure greater current during the high power SMD type IC being tested.

Figure 4A:
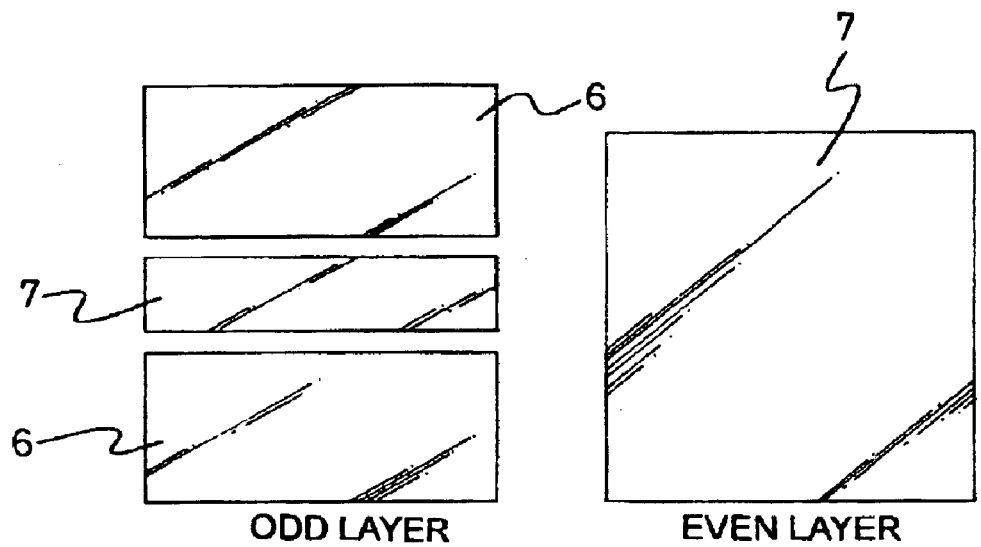
FIGS. 4a to 4C are schematic diagrams illustrate a lower base of a test socket on an IC by way of basic layer method according to the present invention.
Figure 4B:
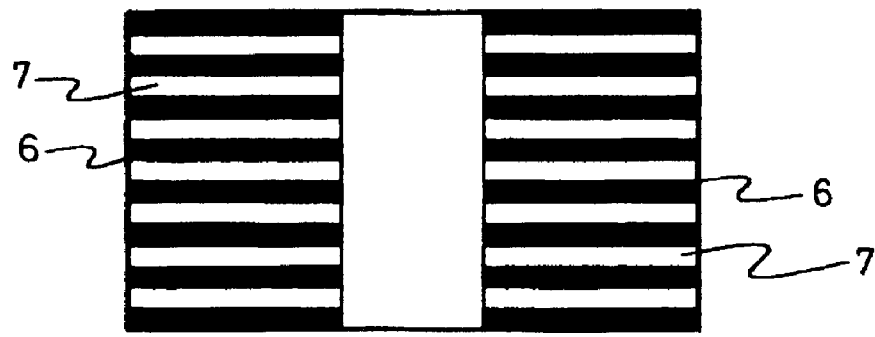
Figure 4C:
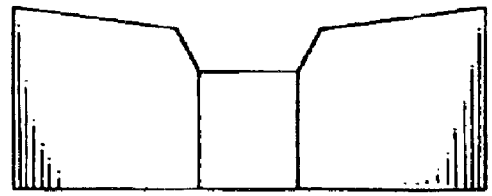

With reference to FIGS. 4a to 4c, a method to make the lower base of a test socket for a SMD type IC by way of accumulation layers is illustrated. It can be seen in FIG. 4a that multiple copper plates 6 and multiple insulation plates 7 are arranged in a sequence of odd layers being copper plates 6 and even layers being insulation plates 7 till needed layers being reached. This fabricating method is called accumulation layer method.

The adhered copper plates 6 and insulation plates 7 with glue are worked with precision machine so as to form a shape in accordance with an angle at the upper portion of the IC. FIG. 4b shows the top view of the finished lower base and FIG. 4c shows the side view of the finished lower base. The SMD type IC 1 has to meet requirement of high precision and it is necessary to have high pressure for pressing the SMD type IC so that the lower base 14 has to be very strong for offering a steady test environment. However, the conventional test socket for the SMD type IC is made by way of plastics forming with stamped copper plates such that the mechanical strength and precision thereof are not able to meet the requirement.

Therefore, the method for making the lower base of a test socket for a high power SMD type IC by way of accumulation layers includes following steps: multiple copper plates 6 and multiple insulation plates 7 are adhered with glue in a sequence of odd layers being copper plates 6 and even layers being insulation plates 7: and once the required layers are reached, the layers are adhered to each other with glue. It is noted that the test socket for the high power SMD type IC is suitable for module forms such as SO, SSOP, TQFP, CQFP and PQFP In the field of semiconductor industry.

Figure 5:
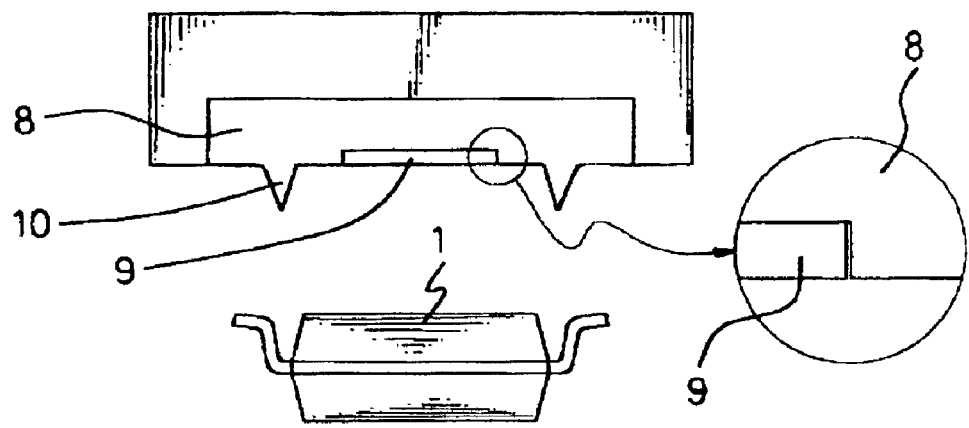
FIG. 5 is a plan view of an upper base of the test socket on the IC being composed of copper and insulation material according to the present invention.

With reference to FIG. 5, a method for making an upper base of IC test socket, which is composed of copper and insulation material. The high power SMD type IC 1 may generate high heat during large current work being performed and it is necessary to guide the heat outward for preventing the IC 1 from damage. Accordingly, a concept of copper substrate is introduced. Because copper is a conductor and the part, which contacts with connection pins of the IC, is made of engineering plastics 8, the bottom of the copper has two juts 10 corresponding to the lower part of the connection pins of the IC 1 to provide proper and definite pressure angles. The engineering plastics 8 at the central part thereof is embedded a copper plate 9 and the copper plate 9 at the edge thereof is press fit with a copper base such that the high heat can be guided to the copper base by the device. A temperature sensor component is inserted into a position of the copper plate 9 and the IC 1 can be detected the temperature thereof from the bottom of the IC directly.

Therefore, the method for making the upper base of a test socket for a high power SMD type IC includes following steps: the upper base at the part for contacting with connection pins of the IC is made of engineering plastics 8; the bottom of the upper base is provided with two juts 10 corresponding to the bottom of connecting pins on the IC 1 so as to offer a proper and definite pressure angle; the engineering plastics 8 at the central part thereof is embedded with a copper plate 9 and the edge thereof is press fit with a copper base so that the high heat generated by the IC can be guided to the copper base directly; and the copper plate 9 is provided a position for being inserted with a temperature sensor component to sense the temperature at the bottom of the IC 1. It is noted that the test socket for the high power SMD type IC is suitable for module forms such as SO, SSOP, TQFP, CQFP and PQFP in the field of semiconductor industry.

Figure 6:
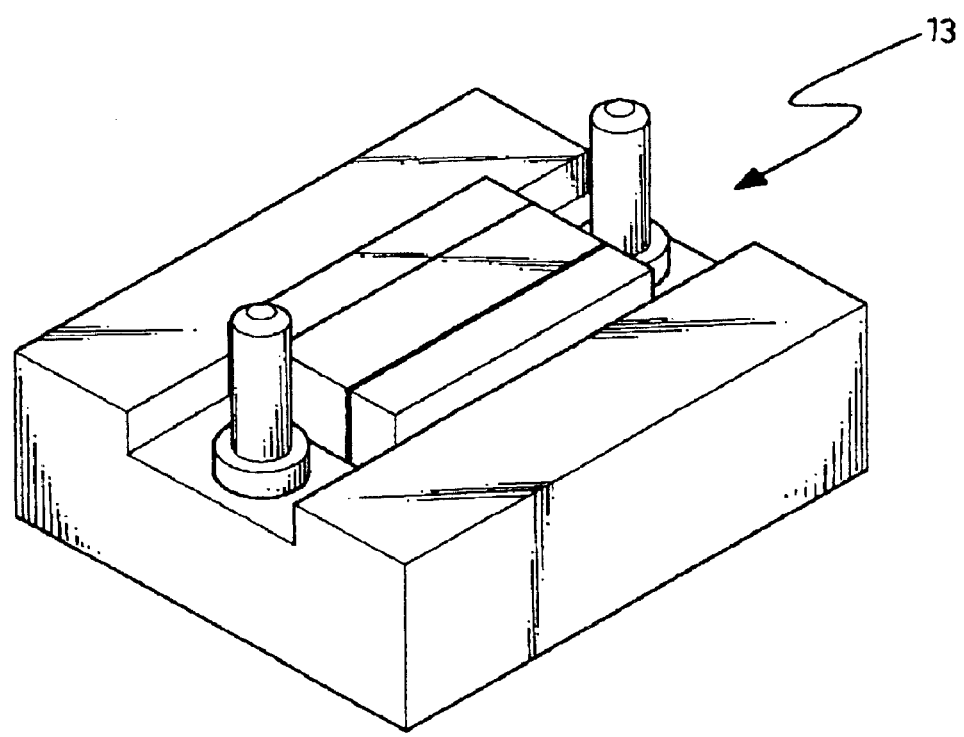
FIG. 6 is a perspective view of a finished upper base of the test socket on the IC according to the present invention.

FIG. 6 shows a finished upper base of the IC test socket according to the present invention. It is noted that it is possible to generate high heat instantaneously during the SMD type IC 1 being in operation and, especially, it Is possible to result in damaging IC 1 in case of the load current being several amperes. In practical application, the present invention is capable of overcoming the problem of instantaneous high heat substantially.

FIG. 7 shows an upper base of the IC test socket shown formed with copper and insulation material in a finished manual IC test socket. It can be seen that a U-shaped elastic plate 11 added with a stir screw 12 offers a forceful point contact pressure and the U-shaped elastic plate 11 is designed to adjust the greatest point contact pressure automatically. For an automation IC test socket, an air cylinder is utilized to supply a steady and fast point contact pressure.

It is appreciated that comparing to the prior art, the test method for high power SMD type IC according to the present invention has the following advantages. It is capable of increasing the contact area between connection pins of the IC and the connection pins of the test socket by way of the SMD type IC being inversely placed and the connection pins of IC being arranged with 8° slant angle are not damaged during the connection pins being inserted into the test socket forcedly. Hence, it is possible to reduce the contact impedance of the connection pins in the test socket such that the test socket can subject greater current during the high power SMD type IC being tested.

While the invention has been described with reference to preferred embodiments thereof, it is to be understood that modifications or variations may be easily made without departing from the spirit of the Invention, which is defined in the appended claims.

What is claimed is:

1. A method for testing a high power SMD type IC, comprising:
    providing a test socket for the SMD type IC;
    inversely placing the SMD type IC on a lower base of the test socket;
    covering an upper base on the test socket; and fixing said upper and said lower bases with a
    U-shaped elastic plate added with a stir screw;
    Whereby, connection pins of the SMD type IC have a contact area with connection pins of the lower base to be increased so as to reduce contact impedance of the connection pins in the test socket for the test socket being capable of enduring great current while the high power SMD type IC is tested.

2. The method as defined in claim 1, wherein the test socket for the high power SMD type IC is suitable for module forms such as SO, SSOP, TQFP, CQFP and PQFP used in a field of semiconductor industry.

* * * * *